United States Patent

Barr et al.

[11] Patent Number: 5,922,522
[45] Date of Patent: Jul. 13, 1999

[54] AQUEOUS DEVELOPING SOLUTIONS FOR REDUCED DEVELOPER RESIDUE

[75] Inventors: Robert Barr, Laguna Niguel; Daniel E. Lundy, Placentia, both of Calif.

[73] Assignee: Morton International, Inc., Chicago, Ill.

[21] Appl. No.: 09/069,518

[22] Filed: Apr. 29, 1998

[51] Int. Cl.$^6$ ..................................................... G03F 7/32
[52] U.S. Cl. ........................... 430/493; 430/311; 430/331
[58] Field of Search ..................................... 430/493, 331

[56] References Cited

U.S. PATENT DOCUMENTS

| | | | |
|---|---|---|---|
| 5,030,550 | 7/1991 | Kawabe et al. | 430/326 |
| 5,106,724 | 4/1992 | Nogami et al. | 430/331 |
| 5,122,438 | 6/1992 | Nogami et al. | 430/303 |
| 5,217,848 | 6/1993 | Uehara et al. | 430/309 |
| 5,340,703 | 8/1994 | Masumi et al. | 430/389 |
| 5,364,736 | 11/1994 | Eramo, Jr. et al. | 430/280 |
| 5,368,982 | 11/1994 | Suzuki et al. | 430/256 |
| 5,393,643 | 2/1995 | Lundy et al. | 430/280 |
| 5,457,011 | 10/1995 | Lehr et al. | 430/493 |
| 5,573,893 | 11/1996 | Fujimoto et al. | 430/493 |
| 5,576,145 | 11/1996 | Keil et al. | 430/281.1 |
| 5,595,860 | 1/1997 | Ishikawa et al. | 430/493 |
| 5,609,991 | 3/1997 | Briguglio et al. | 430/281.1 |

*Primary Examiner*—Hoa Van Le
*Attorney, Agent, or Firm*—Wayne E. Nacker; Gerald K. White

[57] ABSTRACT

An alkaline aqueous developing solution for developing photoresists or the like contains, as an anti-scum agent, an ethoxylated surfactant having the general formula:

$$R\text{—}[O\text{—}(AO)_n]_m\text{—}X \qquad (I)$$

where AO are alkylene oxide units selected from ethylene oxide units ($CH_2\text{—}CH_2\text{—}O$) and propylene oxide units ($CH(CH_3)\text{—}CH_2\text{—}O$) or ($CH_2\text{—}CH(CH_3)\text{—}O$), where R is a hydrophobic group, X is H or an anionic group, m is from 1 to 3, and n is at least about 8, and the molar ratio of total ethylene oxide units to total propylene oxide units is between about 1:4 and about 4:1, preferably between about 2:3 and about 3:2.

12 Claims, No Drawings

AQUEOUS DEVELOPING SOLUTIONS FOR REDUCED DEVELOPER RESIDUE

The present invention is directed to alkaline aqueous development solutions such as are used to develop photoresists.

BACKGROUND OF THE INVENTION

In the process of manufacturing printed circuit boards, UV curable photoresist are used. The exposed portion of the photoresist becomes insoluble in developer solution (dilute alkaline solution) and forms a protective barrier to other processing chemicals (for example, etching and plating solutions). The unexposed portion of the photoresist needs to rinse freely from the circuit board with a mild alkaline solution (for example, 1% sodium carbonate, monohydrate in water). The development occurs because the polymer in the photoresist contains acid functionality. These acid groups within the organic polymer matrix are neutralized in alkaline solution forming a water soluble organic salt. As the dissolved photoresist builds up in solution (called developer loading), insoluble organic materials begin to form in the developing tank, eventually forming a water insoluble scum or residue. The presence of anti-foam additives (conventionally added to developing solutions to minimize foaming) greatly increases the tendency for scum to form. As the level of scum builds, chances increase for an inadvertent redeposit of these water insoluble residues onto the developed circuit board. These redeposited residues cause a retardation of the etching solution (etching chemistries have difficulty penetrating any organic residues). Where the etch is retarded, circuit shorts form causing a defective circuit board. In addition to increasing the potential for defective circuit boards, this residue also makes it difficult to clean equipment increasing maintenance time.

Accordingly, it is a primary object of the present invention to provide developing solutions in which the build-up of scum and residue is reduced. Moreover, the developer described herein will not only reduce the scum, but will minimizer or even eliminate the need for a separate anti-foam agent.

SUMMARY OF THE INVENTION

In accordance with the invention, alkaline aqueous developing solutions, containing between about 0.1 and about 3.0 wt % of a base, are improved by the addition of between about 0.05 and about 1.0 wt % of a surfactant or surfactant mixture, the surfactant(s) having the general formula:

$$[R\text{—}O\text{—}(AO)_n]_m\text{—}X \quad \text{(I)}$$

where AO are alkylene oxide units selected from ethylene oxide units ($CH_2$—$CH_2$—O) and propylene oxide units ($CH(CH_3)$—$CH_2$—O) or ($CH_2$—$CH(CH_3)$—O), where R is a hydrophobic group, typically a hydrocarbon group, X is H or an anionic group, such as carboxylate, phosphate, or sulfate, m is from 1 to 3, and n is at least about 8, preferably at least about 10, provided that the molar ratio of total ethylene oxide units to total propylene oxide units in the surfactant or surfactant mixture is between about 1:4 and about 4:1, preferably between about 3:2 and about 2:3. As a practical matter, n may be up to about 150.

The developing solution may also contain an anti-foam agent, e.g., at between about 0.01 and about 1.0 wt %.

DETAILED DESCRIPTION OF CERTAIN PREFERRED EMBODIMENTS

Aqueous developing solutions to which the present invention generally applies are well known for developing photoresist compositions, both primary photoresists and photoresists which are intended to form hard permanent layers, such as are suitable for solder masks. Examples of such photoresists and the alkaline aqueous development solutions are found, for example, in U.S. Pat. Nos. 5,576,145, 5,609,991, 5,393,643, and 5,364,736, the teachings of each of which are incorporated herein by reference.

The photoresist compositions vary in composition, but typically such photoresist compositions comprise A) between about 20 and about 80 wt % of a binder polymer having an acid number between about 40 and about 250, B) between about 15 and about 50 wt % of α,β-ethylenically unsaturated compounds, typically monomers and short-chain oligomers, and C) between about 0.1 and about 25 wt % of a photoinitiator or photoinitiator chemical system, these weight percentages being based on total weight of A) plus B) plus C).

Typically, the alkaline aqueous solution is a solution of sodium carbonate, e.g., 1% sodium carbonate monohydrate. However, other bases, such as NaOH, KOH, triethanolamine, potassium carbonate etc. may be used to provide the alkalinity necessary for developing photoresists of this type. The alkalinity of the developing solution forms salts with the acid functionality of the binder polymer, typically carboxylic acid functionality, rendering the binder polymer soluble in the alkaline aqueous solution. Thus, photoresists of this type are applied as a layer to a substrate, exposed to patterned actinic radiation, and developed in alkaline aqueous solution which washes away non-exposed, un-polymerized portions of the photoresist layer.

The ethoxylate/propoxylate surfactants used in accordance with the present invention significantly reduce photoresist scum without any reduction in developing performance.

Ethoxylate surfactants by themselves are effective in reducing scum in alkaline aqueous developing solutions, particularly when the ethyoxylate chain is at least about 10 units long, preferably at least about 30 units long. Propoxylate surfactants are significantly less effective. Surprisingly and unexpectedly, however, is the discovery that when a surfactant or surfactant mixture contains a mixture of ethylene oxide and propylene oxide units, such units act synergistically in significantly reducing scum in the developing solution. Accordingly, surfactants having shorter alkylene oxide chains may be used or less surfactant may be used than, for example, using surfactants comprised entirely of ethylene oxide units.

The hydrophobic end, i.e. R in the equation (I) above, may almost any hydrocarbon alcohol having a molecular weight of about 43 or above, including alkyl, alkylaryl, arylalkyl, cycloalkyl alcohols, etc. Alcohols used to form the hydrophobic end include, for example, nonylphenol, octylphenol and tristyrylphenol.

The most effective ethoxylate surfactants for reducing scum and residue are anionic ethoxylate surfactants, e.g., where X is a phosphate (m=1–2). Depending upon the ionic moiety to which the ethoxylate chain is esterified, m may be from 1 to 3. However, the ethoxylate may be non-esterified [X is H, m=1] such that the ethoxylate is non-ionic.

The ethylene oxide units and propylene oxide units may be incorporated in a chain within the same surfactant molecule. However, from a convenience standpoint in terms of what is commercially available, a mixture of a surfactant containing an ethylene oxide unit chain and a propylene oxide unit chain are used to provide the desired molar ratio of ethylene oxide units. Ethoxylate surfactants useful in accordance with the invention are sold, for example, under the trademarks Rhodafac and Igepal by Rhône-Polenc. Propoxylate surfactants useful in accordance with the invention are solf, for example under the trademark Macol by BASF.

The alkaline aqueous solution may also contain an anti-foam agent, such as that sold as Antifoam 80 by Morton International.

The invention will now be described in greater detail by way of specific examples:

EXAMPLES 1–8

1–4 Comparative

To 300 ml. of solutions containing 1 wt % sodium carbonate monohydrate, 0.5 wt % anti-foam agent were added 5.4 grams of Morton International 38G297 photoresist and a total of 3 g (1 wt %) surfactants or surfactant mixture. The solutions were thoroughly mixed and the development of foam was noted. The solutions were filtered and the filtrate dried and weighed. Results are shown in the Table below.

TABLE

| EO Component | Moles of EO | % of Mixture | PO Component | Moles of PO | % of Mixture | % Scum Reduction | Foam Formation |
|---|---|---|---|---|---|---|---|
| 1. RD209 | 9 | 100% | — | — | — | 51% Increase | Moderate |
| 2. — | — | — | RD216 | 16 | 100% | 18% Increase | Very Slight |
| 3. RE 960 | 50 | 100% | — | — | — | 68% Decrease | Slight to Moderate |
| 4. RD230 | 30 | 100% | — | — | — | 21% Decrease | Moderate |
| 5. RD230 | 30 | 50% | RD216 | 16 | 50% | 71% Decrease | Very Slight |
| 6. RD209 | 9 | 50% | RD216 | 16 | 50% | 62% Decrease | Very Slight |
| 7. RE960 | 50 | 50% | RD216 | 16 | 50% | 73% Decrease | Very Slight |
| 8. RE960 | 50 | 60% | RD216 | 16 | 40% | 88% Decrease | Very Slight |

What is claimed is:

1. An alkaline aqueous developing solution comprising between about 0.1 and about 3.0 wt % of a base, the improvement wherein said developing solution for photoresist comprises between about 0.05 and about 1.0 wt % of an alkylene oxide surfactant or surfactant mixture, the surfactant(s) having the general formula:

$$[R\text{---}O\text{---}(AO)_n]_m\text{---}X \tag{I}$$

where AO are alkylene oxide units selected from ethylene oxide units ($CH_2$—$CH_2$—O) and propylene oxide units ($CH(CH_3)$—$CH_2$—O) or ($CH_2$—$CH(CH_3)$—O), where R is a hydrophobic group, X is H or a anionic group, m is from 1 to 3, and n is at least about 8, and the molar ratio of total ethylene oxide units to total propylene oxide units is between about 1:4 and about 4:1.

2. The solution according to claim 1 wherein n is at least about 10.

3. The solution according to claim 1 wherein X is phosphate, m is 1–2.

4. The solution according to claim 1 wherein X is H, m is 1.

5. The solution according to claim 1 wherein the molar ratio of total ethylene oxide units to total propylene oxide units is between about 2:3 and about 3:2.

6. The solution according to claim 1 further comprising between about 0.01 and about 1.0 wt % of an anti-foam agent.

7. A method of preparing a patterned photoresist pattern on a substrate comprising:

providing a layer of a photoresist to a substrate, said photoresist comprising an acid functional binder polymer and photopolymerizable compounds, exposing said layer of photoresist to patterned actinic radiation, and developing said photoresist layer in an alkaline aqueous developing solution for photoresists, said solution comprising between about 0.1 and about 3.0 wt % of a base, the improvement wherein said alkaline aqueous developing solution for photoresists comprises between about 0.05 and about 1.0 wt % of an alkylene oxide surfactant or surfactant mixture, the surfactant(s) having the general formula:

$$[R\text{---}O\text{---}(AO)_n]_m\text{---}X \tag{I}$$

where AO are alkylene oxide units selected from ethylene oxide units ($CH_2$—$CH_2$—O) and propylene oxide units ($CH(CH_3)$—$CH_2$—O) or ($CH_2$—$CH(CH_3)$—O), where R is a hydrophobic group, X is H or a anionic group, m is from 1 to 3, and n is at least about 8, and the molar ratio of total ethylene oxide units to total propylene oxide units is between about 1:4 and about 4:1.

8. The method according to claim 7 wherein n is at least about 10.

9. The method according to claim 7 wherein X is phosphate, m is 1–2.

10. The method according to claim 7 wherein X is H, m is 1.

11. The method according to claim 7 wherein the molar ratio of total ethylene oxide units to total propylene oxide units is between about 2:3 and about 3:2.

12. The method according to claim 7 wherein said alkaline aqueous developing solution further comprises between about 0.01 and about 1.0 wt % of an anti-foam agent.

* * * * *

UNITED STATES PATENT AND TRADEMARK OFFICE
CERTIFICATE OF CORRECTION

PATENT NO. : 5,922,522
DATED : July 13, 1999
INVENTOR(S) : Robert Barr et al.

It is certified that error appears in the above-indentified patent and that said Letters Patent is hereby corrected as shown below:

Column 3, line 45:

Insert "for photoresist" after "solution"

Signed and Sealed this

Fourteenth Day of December, 1999

Attest:

Q. TODD DICKINSON

*Attesting Officer*   *Acting Commissioner of Patents and Trademarks*